United States Patent [19]

Dreyfus et al.

[11] 4,227,086
[45] Oct. 7, 1980

[54] DETECTORS OF PARAMETERS ADAPTED TO ACT ON THE FORCE OF ATTRACTION BETWEEN AN ELECTRET AND AN ELECTRODE

[76] Inventors: Gérard Dreyfus, Résidence Bel Air, Bâtiment 2, Villebon S/Yvette-91120 Palaiseau; Jacques Lewiner, 5, rue Bory d'Arnex, 92210 Saint-Cloud; Didier Perino, 10, rue de Bellevue, 92150 Suresnes, all of France

[21] Appl. No.: 899,862

[22] Filed: Apr. 25, 1978

[30] Foreign Application Priority Data

May 5, 1977 [FR] France .................. 77 13727

[51] Int. Cl.² ................................. G01T 1/185
[52] U.S. Cl. ............................ 250/389; 250/376
[58] Field of Search ............ 250/374, 375, 376, 377, 250/378, 388, 389; 340/600

[56] References Cited

U.S. PATENT DOCUMENTS

| 3,436,542 | 4/1969 | Ganouna-Cohen | 250/376 |
| 3,878,496 | 4/1975 | Erickson | 250/388 X |

FOREIGN PATENT DOCUMENTS 827139 4/1938 France .

Primary Examiner—Davis L. Willis
Attorney, Agent, or Firm—Larson, Taylor and Hinds

[57] ABSTRACT

The device is able to detect the exceeding of a given threshold by a parameter, other than an electric voltage, capable of affecting the electrostatic force of attraction exerted between a charged electret and one, of two electrodes between which said electret is placed, said parameter being for instance an ionizing radiation. The two electrodes are at the same electric potential and the device also comprises return means for urging the first electrode and the electret permanently apart, and means for using the relative displacement of said elements, when it occurs, for desired detection purposes.

16 Claims, 4 Drawing Figures

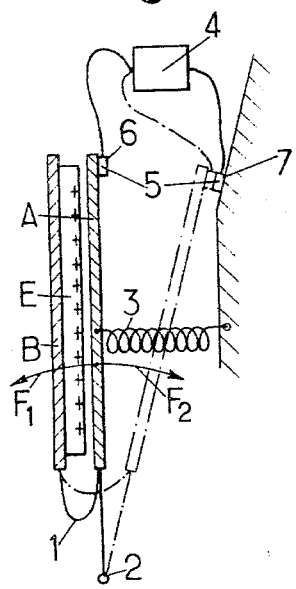
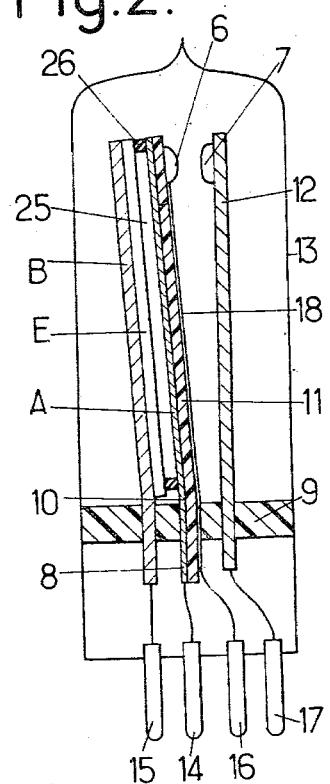
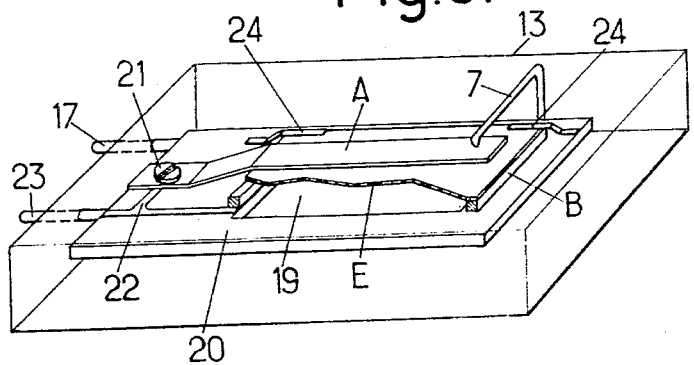
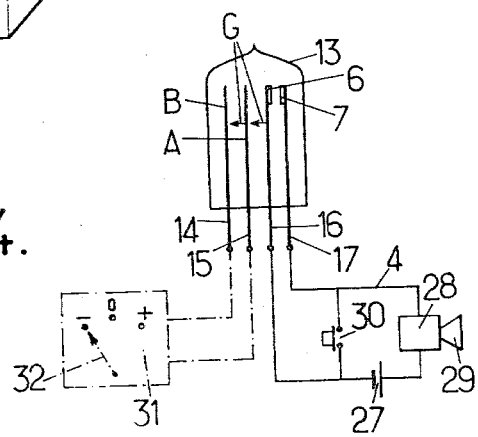

DETECTORS OF PARAMETERS ADAPTED TO ACT ON THE FORCE OF ATTRACTION BETWEEN AN ELECTRET AND AN ELECTRODE

The invention relates to devices adapted to detect the exceeding of a given threshold by a parameter capable of acting on the electrostatic force of attraction exerted between a charged electret and one, A, of two electrodes A and B between which this electret is placed, said parameter being other than a difference in electric potential applied between said electrodes.

It will be recalled that an electret is a dielectric element which is electrostatically charged.

The parameters to the detection of which the present invention relates are, in particular:

(1) ionizing radiation (gamma rays, X-rays, neutrons . . . ) capable of progressively covering the charged face of the electret which is orientated towards the electrode A, with ions of the opposite polarity to that of said charge, so as to progressively neutralize the attractive effect of this charge on this electrode A, (2) the presence in a sufficient concentration, in contact with said charged face, of a fluid such as an organic vapour or a liquid, adapted to discharge this face, either progressively or not, and (3) temperature.

It has already been proposed, particularly in the French Pat. No. 2,294,535 (EN. 74 40506) filed on the Dec. 10th 1974, to provide a control device of the relay type comprising an assembly composed of two electrodes A and B between which an electret is disposed; one, A, of these electrodes being adapted in such a manner as to be able to be displaced in relation to the electret and to the other electrode.

In this control device, a predetermined difference in potential is applied between the two electrodes in such a manner as to pull these two electrodes towards one another and in particular to pull the electrode A against the electret. The change in this difference in potential electrically controls the relative displacement of the electrode A in relation to the electret, this displacement being used for any desired purposes such as the closing or opening of an electric circuit, the release of the blocking of a fluid conduit, the deflection of a beam of light and the like.

The present invention again makes use of an assembly of the above type.

But, according to the invention, it is no longer a modification in the difference in electric potential applied between the two electrodes A and B which is used to control the relative displacement of the electrode A in relation to the electret.

According to the invention, on the contrary, this electrode A remains permanently at the same potential as the electrode B and in order to complete the detection device there are provided:

(1) means to enable the parameter being monitored to act on the electrostatic force of attraction between the electrode A and the electret, (2) return means for producing an opposing force to the electrostatic force of attraction between the first electrode (electrode A) and the electrode which tends to permanently bias the electrode A and the electret apart (3) and means for detecting the relative displacement of the electrode A in relation to the electret which occurs as soon as the above-mentioned electrostatic attraction becomes less than the opposing force of the return means.

In preferred forms of embodiment, recourse is further had to one and/or the other of the following arrangements:

(1) the two electrodes are permanently brought to one and the same zero electric potential.

(2) the two electrodes are permanently electrically connected together, (3) the two electrodes are connected to an assembly permitting selectively, (1) electrically connecting the electrodes together, or (2) the application of a difference in potential to the electrodes which causes movement (pivoting) of the movable electrode, or of a difference in potential opposed to the first potential difference applied between them being adapted to restore the movable electrode to its rest position after movement thereof, In a device according to the previous paragraph, means are provided to measure the value of the difference in potential which is necessary to trigger the movement of the movable electrode.

Mechanical means may be provided to restore the movable electrode to its initial position after movement.

The movable electrode is mounted in such a manner as to be able to be displaced angularly about a fixed axis. This axis is preferably formed by a flexible strip, one end of which is fixed to the frame of the device, The return means may comprise a mechanical spring. Alternatively, the return means may comprise a permanent magnet. In a further embodiment, a second electret is carried by the first electrode (electrode A) and faces the first electret with a face carrying charges of opposite sign to the sign of the charges carried by this first electret.

Advantageously, wedges of insulating material are provided between the electret and the first electrode (A) in such a manner as to preserve a gap between these two elements even when the device is in the state of rest, when the electret and the first electrode A are closest together.

Apart from these principal provisions, the invention comprises certain other provisions which are preferably used at the same time and which will be discussed more explicitly hereinafter.

Preferred forms of embodiment of the invention will be described below with reference to the accompanying drawing but of course in a non-limiting manner.

FIG. 1 of this drawing shows, diagrammatically, a detector constructed according to the invention.

FIG. 2 shows, in vertical section, one embodiment of such a detector.

FIG. 3 shows, in perspective, with parts removed, another embodiment of such a detector.

And FIG. 4 is a diagram of a mode of use of the detector of FIG. 2.

In general, the detectors according to the invention comprise two metal electrodes A and B and, disposed between these two electrodes, an electret E. Electret is a dielectric element which carries on one of its two faces or in its mass electric charges in such a manner as to create an electrical field close to the face in question.

One of the two electrodes, namely the electrode A in the following description, is designed in such a manner as to be able to be displaced in relation to the electret E and hence in relation to the other electrode B under the action of return means when the electrostatic force of attraction exerted thereon by the electret becomes lower than the opposing force of these means as a result of the reduction in said force of attraction.

According to the present invention, the two electrodes A and B always remain subject to the same electric potential and thus it is parameters other than the difference in electric potential between these two electrodes, which are capable of reducing, progressively or not, said force of attraction. Thus the invention is adapted to monitor the chosen parameter by detecting automatically the exceeding of a threshold by the parameter, the reduction in force in question being due either to a discharge of the electret or to a neutralization of its charges by supplying charges of the opposite sign.

For this purpose, displacements of the electrode A, which occur responsive to such exceeding of the threshold, are used in any desirable manner i.e., in cooperation with electrical, magnetic, pneumatic, optical or other means capable, in particular, of lighting a luminous signal, of exciting a sound signal, of triggering a safety or correction operation.

In the form of embodiment shown diagrammatically in FIG. 1, it is assumed that the electret E is a thin foil applied by adhesion, rolling or the like to the electrode B. The latter comprises a fixed plate and the face of said electret opposite to the electrode B, that is, the face orientated towards the electrode A—which itself similarly comprises a plate—carries positive charges. This selection of polarity for the charges carried by the "active" face of the electret E is completely arbitrary and by way of example only, and negative charges would produce similar results.

It is further assumed in FIG. 1 that the two electrodes A and B are permanently connected electrically to one another by a conductor wire 1 and that the only possible displacement of the electrode A is an angular displacement about a pin 2.

Moreover, the return means have been represented by a helical tension spring 3.

Finally, it is assumed that the circuit for using the detector is an electrical circuit 4 controlled by a microswitch 5 comprising a movable contact stud 6 carried by the electrode A and a fixed contact stud 7.

The operation of the device thus shown diagrammatically is as follows.

At rest, the electret E generates a static electric field between the two electrodes A and B: these, constituting the two plates of a flat capacitor are attracted towards one another with a force $F_1$ which is proportional to the square of this field.

The intensity of the opposing return force $F_2$ due to the spring 3 is selected lower than that of $F_1$.

Consequently, at rest, the electrode A remains applied against the fixed electret E (in the position illustrated in full lines).

If the electric field of attraction between the electret E and the electrode A diminishes, or becomes nil, either because the electret is discharged or because ions of the opposite polarity to that of the charges carried by this electret accumulate against the latter, the force of attraction $F_1$ diminishes. Finally, when it becomes less than the return force $F_2$, the electrode A is displaced and presses the movable contact 6 against the fixed contact 7 (the position illustrated in chain lines in FIG. 1), which closes the circuit 4. The closing of this circuit is then used for the desired purposes: such as an alarm, of safety, correction, etc.

It should be noted that the force of attraction due to the electric field varies as the inverse of the square of the distance between the electrode A and the electret E. Thus, this force is reduced abruptly as soon as the displacement of the electrode A begins, tending to move this electrode away from the electret.

In the embodiments of FIGS. 2 and 3, several of the elements described above are shown again, with the same reference numerals as before.

In the embodiment in FIG. 2, the electrode A consists of a relatively rigid metal strip connected to its foot 8, which is embedded in a base 9, by a resiliently flexible region 10. Region 10 may be a thinner or notched portion of the strip itself or may consist of an independent member.

Here, the contact stud 6 is electrically insulated from the strip A by an insulating layer 11 deposited on strip A, for example, by atomization under vacuum or chemically.

The fixed contact stud 7 is carried by a rigid conductor support 12, the foot of which is embedded in the base 9, like those of the electrodes A and B.

The assembly consisting of the elements A, B, E, 9, 11, 12, is placed in a sealed bulb 13 from which there emerges four pins 14, 15, 16 and 17 electrically connected respectively to the electrodes A and B and to the contacts 6 and 7. The electrical connection between the pin 16 and the contact 6 is ensured by means of a conductor path 18 applied in any desirable manner to the insulating layer 11.

This embodiment enables the electrical circuit containing the electrodes A and B to be insulated from that containing the contacts 6 and 7, which may have certain advantages as will be explained later on with reference to FIG. 4.

The embodiment shown diagrammatically in FIG. 3 enables the electret E to be replaced easily after operation of the detector, which is of interest when such a replacement is necessary between two successive operations of this detector.

The electrode B consists of a conductor frame. Stretched over this frame is a layer of metal such as a thin foil which constitutes the electret E. The frame is in electrical contact with this layer.

The assembly consisting of the electrode B and the electret E is mounted at the edge of a window 19 hollowed out of an insulating plate 20.

The electrode A is a conducting strip, the foot of which is fixed to the plate 20 by a belt-nut system 21. The free end of this strip is disposed at the side of the foil E opposite to the frame electrode B and tends to move away resiliently from this foil to come into contact with the overhanging end of an arm of conducting metal constituting the fixed contact 7.

Of course, this electrode A is adapted in such a manner that the electrostatic attraction of the electret has the effect of applying it against the latter.

The foot of the electrode A is electrically connected by conductors 22, formed, for example, by the metal areas of a circuit printed on the plate 20, both to the frame electrode B and to a pin 23 which projects to the outside of a hermetic casing 13 surrounding the device. Pin 23 here in this embodiment replaces all the pins 14, 15, 16 of the embodiment of FIG. 2.

The contact 7, in turn, is electrically connected to a pin 17 which projects outside of casing 13 parallel to the pin 23.

The advantage of this embodiment lies in that the assembly of the frame B and of the foil E is mounted in such a manner as to be removed easily from the device once the casing 13 is removed. For this purpose, this assembly is held pressed against the plate 20 by means of four resilient pincers 24 so that the assembly can slide between these pincers and the plate 20 for replacement.

The fixed electrode B may consist of any desirable material which is a conductor of electricity, such as solid brass.

The strip electrode A may advantageously consist of steel or of resilient bronze with a thickness between 10 and 500 microns.

The contact studs 6 and 7 may advantageously consist of gilded contacts or of contacts wetted with mercury or with a conducting grease.

As for the electret E, it may advantageously be made from a foil or sheet of a polymer material selected from among the following: polyethylene, polypropylene, terephthalate of polyethylene, polytetrafluoroethylene, polycarbonate, halogenated polyhydrocarbide (for example a copolymer of hexafluoropropylene and tetrafluorethylene) polyvinylidene fluoride, a compound with a base of at least 95% of polychlorotrifluoroethylene, a compound with a base of polychlorotrifluoroethylene and polytetrafluoroethylene, a compound with a base of polyvinylidene fluoride and polytetrafluoroethylene, or a compound consisting of one of the preceding polymers with magnesia and polyacetal.

The thickness of the electret is preferably between 1,000 angströms and 200 microns. Below 3 microns, it may be prepared, for example, by deposition under vacuum (cathodic atomization).

The electret may likewise consist of a mineral material (alumina for example) in which electric charges have been included, for example by electronic or ionic implantation or in which conducting elements have been included and charged.

The phenomenon to be detected may be an ionizing radiation.

In such a case, a gap 25 (FIG. 2) is provided which contains an ionizable gas between the electret E and the electrode A by means of wedges 26 interposed between this electret and this electrode and carried by one and-/or the other of these two elements. These wedges form either a discontinuous frame or two parallel bars, or some studs. The ionizable gas may be air, possibly under reduced pressure, or a gas which can be ionized more easily than air. For example, if the radiation to be detected consists of gamma rays or X rays a mixture of a rare gas such as neon, with a halogen such as bromine may be used.

If the radiation to be detected consists of neutrons, a layer of boron or of lithium may be deposited on the face of the electrode A facing the electret and thus constituting a target for the neutrons. These substances give rise respectively to the following reactions when they are bombarded by neutrons:

$B^{10}(n,\alpha)Li^7 + 2.78$ Mev and
$Li^6(n,\alpha)H^3 + 4.78$ Mev.

In general, for the detection of a neutron radiation, the charge given to the electret is a polarity opposite to that of the ions liable to be produced by the reaction of the neutrons to be detected with the target or the gas disposed close to the electret.

In order to form a barrier of ions of the opposite sign to that of the charge on the charged face of the electret, which barrier is capable of counteracting the effect of electrostatic attraction exerted by the latter on the electrode A, it is possible to provide that the ionizing radiation to be detected affects said face through the electret itself and/or one at least of the two electrode. For example, the radiation could affect the electrode B which then consists of a relatively thin layer of metal, or a metal (gold, aluminium) permeable to the particles to be detected, or a sheet of polymer constituting the electret.

It will be noted that the embodiment of FIG. 3 above lends itself particularly well to a construction of this type.

In the various embodiments above, the detector should be enclosed in an enclosure permeable to the radiation to be detected but sufficiently hermetic to prevent any reaction between the above-mentioned substances and the components of the atmosphere.

Of course, any desirable screen may be provided around the detector in such a manner as to partially absorb some of the radiation of the environment in which it is situated. Such a screen may, be an electrostatic screen consisting for example of the metal of the bulb 13 or of a grid or a cage, so long as it is capable of isolating the device from external electromagnetic parasites.

In order to maintain the energy of the radiation being studied or absorbed in the detector equal or proportional to that absorbed in a human tissue, it may likewise be an advantage to constitute the largest possible number of the elements comprising this detector, and particularly the casing which contains it, of a material having the same coefficient of absorption as tissue with respect to said radiation. It is known that such a material as, for example, a compound with 10.2% of hydrogen (such as that comprising 66.1% of polyethylene, 11.1% of polyformaldehyde and 22.8% of magnesia) is suitable for neutrons, and a compound without hydrogen (such as that comprising 57% of polyetrafluorethylene $(CF_2-CF_2)_n$ and 43% of carbon) is suitable for beta, gamma and X rays.

The phenomenon to be detected may likewise be the presence of a fluid capable of discharging the electret, said fluid consisting, in particular, of an organic vapor, or even of a liquid. The fluid is brought into contact, in an adequate concentration, with the active face of this electret.

In such a case it is, of course, necessary for the enclosure inside which the detector is contained, to be porous to said fluid.

The phenomenon to be detected may also be temperature since the distribution of the electrical charges carried by an electret can be modified in time by heating it.

The means for urging the electrode A may be constituted in any desirable manner other than by an actual spring 3 as in FIG. 1 or by the inherent resilience of the base of a strip constituting this electrode as in FIGS. 2 and 3.

In particular, the two electrodes A and B may consist of the two legs of one and the same resilient metal strip folded into U-shape. The curved base of this U then serves both as an electrical connecting member between the two electrodes A and B and as a resilient return member tending to part these electrodes from each other.

According to a modification, the electrode A may be urged to move away from the electret E by its own weight. The electrode is then disposed below the electret and constituted or weighted in such a manner as to be sufficiently heavy.

According to yet another modification, the return of the electrode A is effected magnetically.

For this purpose, a fixed permanent magnet is disposed opposite a magnetic or magnetizable region of this electrode at a distance from said region which can preferably be adjusted with precision by a screw adjustment.

This modification is a particular advantage since the magnetic attraction exerted by the magnet on the electrode A is inversely proportional to the square of the distance between this magnet and this electrode.

As a result, said magnetic attraction is relatively slight so long as the electrode A is applied against the electret, which ensures a satisfactory stability of the device with respect to shocks.

On the other hand, when the electrode A begins to move away from the electret, the force urging the two apart increases rapidly, which ensures precise control of the device.

Finally, the magnetic force of attraction between the magnet and the electrode becomes maximum when the contacts 6 and 7 are applied one against the other, which ensures a firm mechanical and electrical contact between these two studs.

Instead of mounting the electrode A so as to be flexible about its base or pivotable about a hinge, it may be left free to be displaced parallel to itself, possibly by means of a resilient support. For example, it could constitute of a pellet enclosed with slight peripheral play in a cylindrical or prismatic casing, one end of which consists of the electrode B covered with the electret E and the other end of which carries the contact stud 7 towards the inside of the casing.

In order to increase the electrostatic force of attraction exerted on the electrode A by the electret E without increasing the charge of this electret, which would risk reducing the sensitivity of the detection (since it would be necessary to attribute a higher value to the threshold to be monitored, for which said force of attraction is neutralized), recourse may advantageously be had to an arrangement wherein a second electret carrying charges the sign of which is opposite to the sign of the charges carried by this electret E is placed on said electrode A, facing the electret E.

With this arrangement, the above-mentioned electrostatic force of attraction is doubled without increasing the charge of each electret and therefore without reducing the sensitivity of the device.

If it is desired to increase the sensitivity in question without particularly increasing the above-mentioned force of attraction, it is likewise possible to take advantage of the doubling obtained by this force, other things being equal, by reducing the charge of each of the two electrets.

The displacements of the electrode A may be transduced in a manner other than electrically. For example, these displacements can be used to block, release or deflect a luminous control beam, or to block or release an orifice of a pipe in which a control fluid is circulating.

Again, considering an electrical transducer embodiment, such an embodiment a may utilize the displacements of the electrode A in ways other than by closing a circuit 4. For example, application of a movable contact permanently connected to one end of this circuit and carried by the electrode A against a fixed contact connected to the other end of said circuit would be suitable.

Thus such a circuit 4 may be closed by application of a movable bridge carried by the electrode A against two contacts themselves permanently connected to two ends of the circuit in question.

The displacement of the electrode A may likewise be used to open an electrical circuit instead of to close one. Or, the displacement could even be used to open one electric circuit and to close another at the same time, in the manner of a change-over switch.

It is also possible to multiply the number of electrical contacts capable of being established or opened by the displacement of a single electrode A by having this electrode to carry a plurality of movable contact studs. Each stud is then adapted to cooperate in parallel with as many fixed contact studs as desired, thereby forming part of as many distinct electrical circuits as desired.

A considerable advantage of the detection devices of the invention lies in that their operation does not require any inherent source of energy; the motive energy is, in fact, supplied in two ways.

First, this energy can be supplied by the phenomenon itself, for which it is intended to detect the exceeding of a threshold.

Second, the energy can be supplied by the return means, the effect of which is released by exceeding the threshold.

These devices can therefore be maintainined in a "watching" state for a long time without any risk of failure of any source of energy.

By way of comparison it will be recalled that the ionizing radiation detectors known at present (Geiger counters, discharge tubes . . . ) require elaborate supply voltages and even high voltages for some of them.

Moreover, the devices of the invention are particularly simple to manufacture and in operation, are inexpensive, light, and of small overall size.

Further, their design itself leads to a maximum security. In fact, in the event of accidental discharge of the electret, the device is automatically triggered and passes from its "watching" state to its "alarm" state.

These characteristics enable them to be used, in particular, as extremely reliable portable individual detectors in place of the present devices having sensitive films which have to be constantly examined and read for safety purposes.

FIG. 4 illustrates in full lines a complete portable detector assembly constructed by means of a device in accordance with FIG. 2 above, enclosed in a hermetic bulb 13 from which there emerge four pins 14, 15, 16 and 17. The two pins 16 and 17 are connected in series with an electric battery 27 and an oscillator 28 which in turn feeds a small loud-speaker 29. The two pins 14 and 15 are connected to one another.

It will be seen that as soon as the predetermined threshold is exceeded by the phenomenon to be detected, the closing of the circuit 4 energizes oscillator 28 which causes the emission of a sound signal by the loud-speaker 29.

It should be noted that the discharge of the battery 27 is practically nil in the watching state because it does not deliver any current, i.e., it only delivers a current in the case of an alert.

In order to check that the voltage of this battery is always sufficient to trigger the alert, a push-button switch 30 or the like, for enabling the circuit 4 to be closed momentarily, can be mounted in parallel with the two pins 16 and 17.

According to another improvement, shown diagrammatically in chain line in FIG. 4, the two pins 14 and 15 are connected to a circuit 31. This will enable either of these two pins to be connected electrically to one another (position O of the diagrammatic index 32) or enable a positive direct voltage (position +) or a negative direct voltage (position −) to be applied between these two pins.

Such an improvement provides the following sequence of steps.

First, the electrode A is electrically controlled to pivot out of its position of rest in which it is applied against the electret into its "active" position in which it closes the circuit 4, which enables the operation of this latter circuit for testing and more generally the operation of the detection device as a whole.

Second, the device to be restored to its initial watching state, again by electrical control.

Finally, an identical potential is again applied to the two electrodes A and B of the device which is thus restored to its watching state.

This succession of operations also enables the measurement of the dose of the parameter to be monitored which has been received by the device, even if this dose was not sufficient to trigger the device. The dose is associated with the value of the direct voltage V which was required to ensure said triggering electrically.

According to yet another improvement, checking means are provided (symbolized by the arrows G in FIG. 4) consisting, in particular, of a push button which enables the movable electrode to be restored mechanically to its normal position of rest against the electret after it has rocked. This arrangement enables the user of the detector to check that the pivoting in question was, in fact, caused by the exceeding of the threshold to be detected and not by another external reason such as a mechanical shock. In fact, after it has mechanically been restored to its position by the checking means in question, the movable electrode will pivot again if the threshold in question has in fact been exceeded and will only remain in position in the opposite case.

Some numerical examples corresponding to effective experiments carried out by means of the detector devices according to the invention are given purely by way of illustration below.

Example 1. A detection device in accordance with FIGS. 2 and 4, comprising an electret of polypropylene 10 microns thick, enabled an alarm signal to be given for doses of X rays comprised between 100 mRem and 10 Rem and more, according to the charge of the electret and the resilient return force of the electrode A.

Example 2. A device of the type in Example B 1, but comprising an electret of 1 cm² in a copolymer of hexafluoropropylene and tetrafluorethylene 12.7 microns thick, placed at a distance of one centimeter from a source of cobalt 60, with an activity equal to 100 microcuries, enabled an alarm signal to be given at the end of a period of between 6 minutes and 10 hours, which corresponds to an exposure dose of between 0.13 and 13 R or a total absorbed dose of between 110 m Rad and 11 Rad.

Example 3. A device identical to that of example 2, placed in a drying oven enabled an alarm signal to be given about 24 hours after the temperature and reached 160° C.

Example 4. A device identical to that of example 1, placed in an enclosure containing chloroform vapours enabled an alarm signal to be given at the end of a period of 10 minutes for a vapour pressure equal to the saturating vapour pressure.

As goes without saying and as follows from the above, the invention is in no way limited to those of its modes of application and embodiment which have been envisaged above in particularity. Rather, it includes all the modifications, particularly:

those where, contrary to what has been adopted for the forms of embodiment illustrated, the electret E is mounted on the movable electrode, which would then be the electrode B, the above-mentioned electrode A then being fixed and the return means which permanently urge this electrode A and the electret E towards mutual spacing then acting on the electrode B;

and those where at least one of the electrodes appears in a form other than that of a plate with smooth faces and particularly in the form of a plate bounded by at least one face comprising roughness or in the form of a wire, a grid, a point, and in particular in such a manner as to increase the local intensity of the electric field and to encourage the secondary electronic or ionic emissions.

We claim:

1. A device for detecting the exceeding of a given threshold by a parameter capable of affecting the electrostatic force of attraction exerted between a charged electret and one of two electrodes between which said electret is disposed, the parameter being other than a difference in electrical potential, and the two electrodes being at the same electrical potential, said device comprising means for enabling said parameter to affect said electrostatic force of attraction, return means for exerting an opposing force to said electrostatic force of attraction which serves to bias the said one electrode and the electret apart and detection means for detecting the relative displacement of the one electrode in relation to the electret which occurs when said electrostatic force of attraction becomes less than the opposing force of the return means.

2. A detection device as claimed in claim 1, where the two electrodes are permanently electrically connected together.

3. A detection device as claimed in claim 1 wherein the parameter to be monitored is an ionizing radiation.

4. A detection device as claimed in claim 1 wherein the parameter to be monitored is the concentration of a fluid adapted to discharge the electret.

5. A detection device as claimed in claim 1, wherein the two electrodes are connected to an assembly for selectively providing a plurality of operative modes including a first mode where said electrodes are connected together electrically, a second mode wherein a difference in potential is applied between said electrodes adapted to trigger displacement of the said one electrode, a third mode wherein a difference in potential of the opposite polarity to that of the second mode is applied between said electode which is adapted to restore the said one electrode to a position of rest.

6. A detection device as claimed in claim 5 further comprising means for measuring the threshold value of the difference in potential necessary to trigger displacement of the said first electrode.

7. A detection device as claimed in claim 1 further comprising mechanical means for restoring said one electrode to its initial position after displacement.

8. A detection device as claimed in claim 1 wherein said device includes a frame and the said one electrode is mounted in such a manner as to be able to be displaced angularly about a fixed axis comprising a flexible strip one end of which is fixed to the frame of the device.

9. A detection device as claimed in claim 1 wherein at least one of the electrodes is constituted in such a manner that the parameter to be monitored exerts a force on the electret through the at least one electrode.

10. A detection device as claimed in claim 1 wherein the return means comprises a mechanical spring.

11. A detection device as claimed in claim 1 wherein the return means comprises a permanent magnet.

12. A detection device as claimed in claim 1 wherein a second electret is carried by the said one electrode and is disposed so as to face the first electret with a surface carrying charges of the opposite sign to the sign of the charges carried by this first electret.

13. A detection device as claimed in claim 1 wherein wedges are provided between the electret and the said one electrode in such a manner as to preserve a gap between even the electret and said one electrode when the device is in the state of rest and thus the electret and the said one electrode are at their closest proximity.

14. A detection device as claimed in claim 13 wherein said parameter to be monitored is an ionizing radiation and wherein the surface of the electret which faces said one electrode is brought into contact with a gas which can be ionized more easily than air at normal pressure.

15. A detection device as claimed in claim 1 wherein said detection means comprises an electrical circuit capable of being closed by an electric switch having a movable contact and is carried by the said one electrode.

16. A detection device as claimed in claim 15 wherein the movable contact carried by the said one electrode is electrically insulated therefrom.

* * * * *